United States Patent [19]

Ohmagari et al.

[11] Patent Number: 5,553,318
[45] Date of Patent: Sep. 3, 1996

[54] TRANSMITTER HAVING ENVELOPE FEEDBACK LOOP AND AUTOMATIC LEVEL CONTROL LOOP

[75] Inventors: Shinichi Ohmagari; Osamu Yamamoto, both of Tokyo, Japan

[73] Assignee: NEC Corporation, Japan

[21] Appl. No.: 536,342

[22] Filed: Sep. 29, 1995

[30] Foreign Application Priority Data

Sep. 30, 1994 [JP] Japan .................................. 6-236314

[51] Int. Cl.⁶ ........................................................ H04B 1/04
[52] U.S. Cl. ........................................................ 455/126
[58] Field of Search ................................ 455/126, 127, 455/95, 114, 115, 117, 118, 119; 330/149, 134

[56] References Cited

U.S. PATENT DOCUMENTS 5,054,116  10/1991  Davidson ................................ 455/126
5,208,549   5/1993  Andoh ..................................... 330/129

FOREIGN PATENT DOCUMENTS 4-287457  10/1992  Japan .

OTHER PUBLICATIONS

*Patent Abstracts of Japan*, vol. 017, No. 094 (E–1325), 24 Feb. 1993 & JP–A–04 287457, Oct. 13, 1992.

*Primary Examiner*—Andrew Faile
*Assistant Examiner*—Nguyen Vo
*Attorney, Agent, or Firm*—Ostrolenk, Faber, Gerb & Soffen, LLP

[57] ABSTRACT

It is an object of the present invention to provide a transmitter which is inexpensive and small in size and is reduced in power dissipation and besides wherein the output power of a power amplifier can be varied to an arbitrary value. A phase modulator, a variable attenuator, a high power amplifier, a directional coupler, a detector, an error amplifier, a switch and an analog multiplier form an envelope feedback loop. The envelope feedback loop controls an envelope of a modulated wave detected by the detector so that a base band signal and the envelope of the modulated wave may coincide with each other. The circuits mentioned above, a smoothing circuit, another error amplifier, another switch and an adder form an operation point feedback loop. The operation point feedback loop smoothes an error of an output envelope detection signal of the detector and controls so that the smoothed error may be in the minimum.

5 Claims, 7 Drawing Sheets

TRANSMITTER HAVING ENVELOPE FEEDBACK LOOP AND AUTOMATIC LEVEL CONTROL LOOP

FIELD OF THE INVENTION

This invention relates to a transmitter, and more particularly to a transmitter which transmits a signal power amplified by a power amplifier.

BACKGROUND OF THE INVENTION

As a modulation system for a transmitter in the field of mobile communications in a microwave band or mobile satellite communications, a narrowband linear modulation system such as four-phase shift keying (QPSK) or π/4 shift QPSK is adopted for a modulation system for a modulator in a transmitter in order to achieve effective utilization of frequency resources and reduction in transmission distortion.

Not only transmitters of the type mentioned are required to transmit modulated waves of a narrow band, but also a power amplifier thereof which amplifies a modulated wave is required to perform a strictly linear operation in order to assure an improved expansion of a spectrum of modulated waves. Accordingly, efforts for improvement of conventional transmitters have been directed to the elevation of the saturation level of the output of a power amplifier and the improvement of the linearity of the output.

Where a power amplifier having a non-linear phase characteristic is used, a transmitter which employs an automatic gain control (AGC) circuit and a phase modulation circuit as shown in FIG. 1 to suppress the expansion of a spectrum is conventionally known (Japanese Patent Laid-Open Application No. Heisei 4- 287457, the title of the invention: "Phase Compensation System for Power Amplifier").

In the conventional transmitter just mentioned, as shown in FIG. 1, a modulated wave inputted by way of input terminal 1 and having a comparatively small amplitude distortion is supplied to AGC circuit 2, and simultaneously, an envelope of the modulated wave is detected by envelope detection circuit 6. The output modulated wave of AGC circuit 2 is phase modulated by phase modulation circuit 3 and then supplied to power amplifier 4, by which it is power amplified. The output signal of power amplifier 4 is outputted to output terminal 5 and simultaneously supplied to envelope detection circuit 8.

Differential amplifier 7 compares the envelope detection signal of the input modulated wave having a comparatively small amplitude distortion, which is inputted from envelope detection circuit 6, with the envelope detection signal of the modulated wave having an amplitude distortion generated upon amplification by power amplifier 4, which is inputted from envelope detection circuit 8, and controls the gain of AGC circuit 2 with a signal of difference between the envelope detection signals. Consequently, an amplitude distortion generated upon amplification of power amplifier 4 is suppressed.

Further, the envelope detection signal outputted from envelope detection circuit 6 is supplied to phase modulation circuit 3, and phase modulation circuit 3 controls power amplifier 4 so that it performs phase modulation of a characteristic opposite to the phase characteristic of power amplifier 4. Consequently, a phase distortion of the output signal generated by power amplifier 4 is suppressed, and degradation of the carrier power to noise power ratio (C/N) is reduced.

However, in the conventional transmitter which controls the expansion of a spectrum by raising the saturation level of the output of the power amplifier or by improving the linearity of the output, an increased cost is required for the power amplifier. Further, since the power dissipation increases, a large heat radiation mechanism is required, resulting in increase of the overall size of the entire transmitter.

Further, the conventional transmitter shown in FIG. 1 requires an expensive high frequency detection circuit for each of envelope detection circuit 6 and envelope detection circuit 8 provided on the input side and the output side of the transmitter, respectively, because the signal inputted to input terminal 1 is a phase modulated wave of a high frequency. Further, since the conventional transmitter requires two phase modulation circuits including another phase modulation circuit not shown, it is disadvantageous in that it requires a high cost. The conventional transmitter is disadvantageous also in that it cannot have variable output power.

SUMMARY OF THE INVENTION

The present invention has been made to eliminate the disadvantages described above, and it is an object of the present invention to provide a transmitter which is inexpensive and small in size and is reduced in power dissipation.

It is another object of the present invention to provide a transmitter which is always controlled to operate at an optimum operation point automatically and can achieve a stabilized distortion improvement effect even where the output level varies.

It is a further object of the present invention to provide a transmitter wherein the output power of a power amplifier can be varied to an arbitrary value.

It is a still further object of the present invention to provide a transmitter which can prevent increase of a distortion even if the output level varies over a wide range and can prevent the output level from varying discontinuously.

In order to attain the objects described above, according to the present invention, there is provided a transmitter, which comprises a modulator for linearly modulating a carrier from an oscillator with a modulating signal and outputting a modulated wave, a power amplifier for power amplifying the output modulated wave of the modulator, a directional coupler for branching the power amplified modulated wave from the power amplifier into two branched modulated waves, one of which is outputted to a transmission outputting element, a detector for detecting an envelope of the other branched modulated wave from the directional coupler, first error signal generating means for generating and outputting an error signal between a smoothed signal of the output detection signal of the detector and a first reference voltage, a first multiplier for multiplying the error output signal of the first error signal generating means and a band-limited base band signal, second error signal generating means for generating and outputting an error signal between the output detection signal of the detector and a full wave rectified signal of an output signal of the first multiplier, and a second multiplier for multiplying the error output signal of the second error signal generating means and the base band signal and supplying a result of the multiplication as the modulating signal to the modulator.

The transmitter of the present invention may further comprise a variable attenuator for attenuating the output signal of the modulator in accordance with a control signal and outputting the attenuated signal to the power amplifier, and a smoothing circuit for smoothing the error output signal of the second error signal generating means and outputting a signal obtained by the smoothing as the control signal to the variable attenuator.

The transmitter of the present invention may further comprise voltage varying means for varying the first reference voltage to be inputted to the first error signal generating means to a variable reference voltage.

The transmitter of the present invention may further comprise a first switch for outputting the error output signal of the first error signal generating means to the first multiplier when output power of the power amplifier is equal to or higher than a predetermined value but outputting, when the output power is lower than the predetermined value, the error output signal of the first error signal generating means as the control signal to the variable attenuator, a second switch for outputting the error output signal of the second error signal generating means to the second multiplier when the output voltage is equal to or higher than the predetermined value but outputting, when the output power is lower than the predetermined value, a second reference voltage to the second multiplier, and a third switch for outputting the output signal of the smoothing circuit to the variable attenuator when the output power is equal to or higher than the predetermined value but intercepting, when the output power is lower than the predetermined value, outputting of the output signal of the smoothing circuit to the variable attenuator.

In the transmitter of the present invention, a feedback loop formed from the modulator, the power amplifier, the detector, the second error signal generating means and the second multiplier constructs an envelope feedback loop, and controls so that the base band signal and the envelope of the modulated wave may be same as each other. Further, by means of a loop formed from the detector, the first error signal generating means and the first multiplier, the reference amplitude of the envelope feedback loop to be supplied from the first multiplier to the second error signal generating means can be made as a variable amplitude.

Further, in the transmitter of the present invention, another feedback loop formed from the variable attenuator, the power amplifier, the detector, the second error signal generating means and the smoothing circuit constructs an operation point feedback loop, and controls so that the smoothed value of the error output signal of the second error signal generating means may be in the minimum.

Further, in the transmitter of the present invention, since the first reference voltage can be made a variable reference voltage by the voltage varying means, the reference amplitude of the envelope of the envelope feedback loop can be varied arbitrarily.

Furthermore, in the transmitter of the present invention, when the output power of the power amplifier is lower than the predetermined value, the envelope feedback loop and the operation point feedback loop can be opened by means of the first to third switches while a feedback loop by which the error output signal of the first error signal generating means is inputted as the control signal to the variable attenuator can be formed.

EMBODIMENTS

Figure 1:
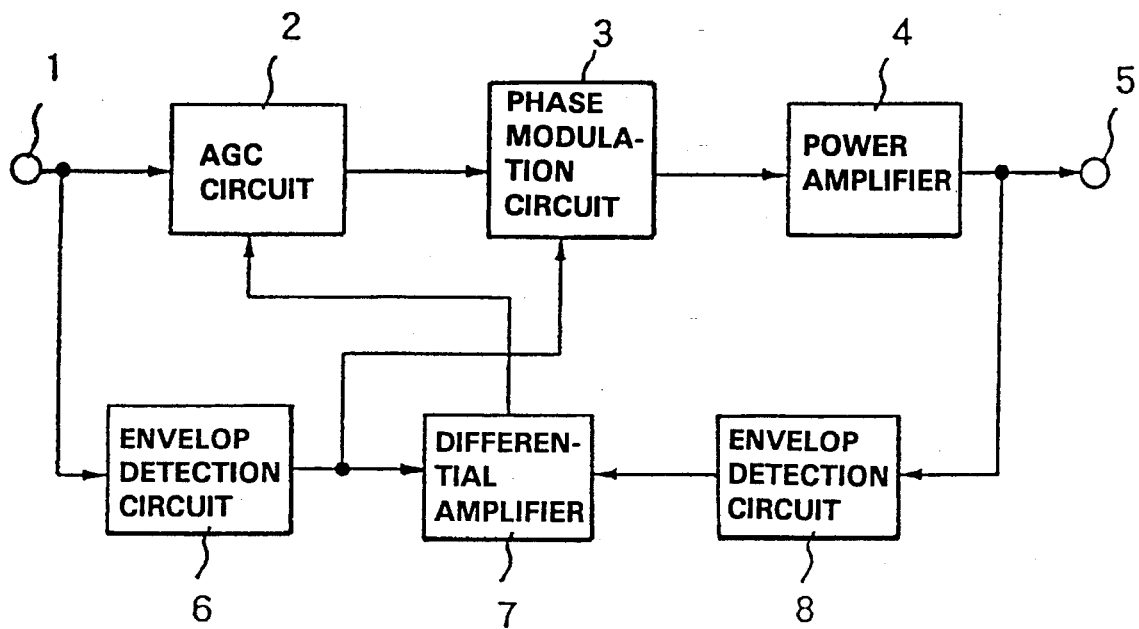
FIG. 1 is a block diagram of a conventional example.
Figure 2:
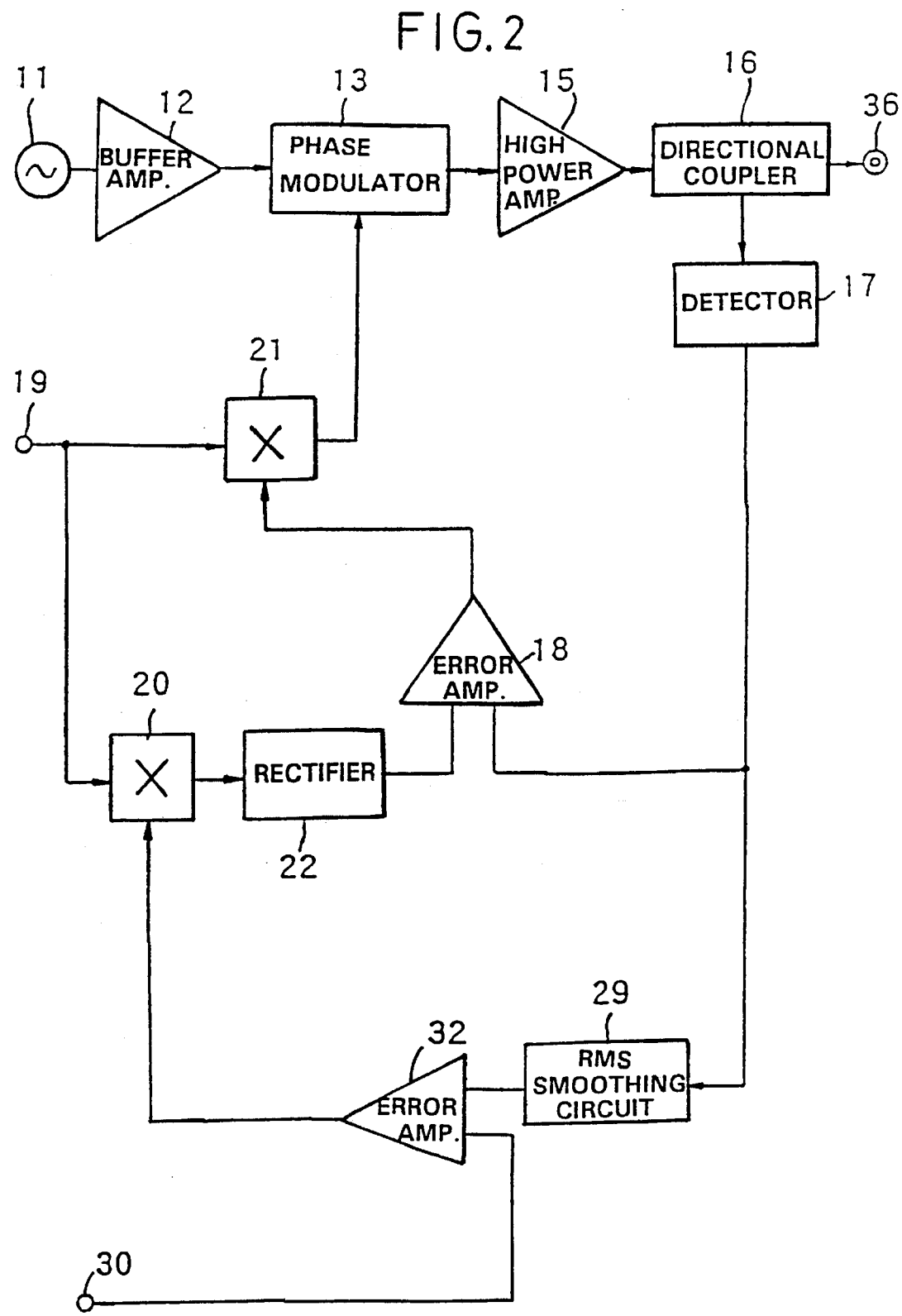
FIG. 2 is a block diagram of a first embodiment of the present invention.

Embodiments of the present invention are described below with reference to the drawings. FIG. 2 is a block diagram of the first embodiment of the present invention. As shown in FIG. 2, the embodiment of the present invention includes oscillator 11, buffer amplifier 12, phase modulator 13, high power amplifier (HPA) 15, directional coupler 16, detector 17, error amplifiers 18 and 32, analog multipliers 20 and 21, rectifier (full wave rectifier) 22, reference voltage terminal 30 and RMS smoothing circuit 29.

Oscillator 11 oscillates and outputs a carrier of a predetermined frequency. Phase modulator 13 modulates the carrier in accordance with a predetermined phase modulation system, for example, a BPSK (Binary Phase Shift Keying) system. High power amplifier 15 power amplifies an input signal thereto with a high efficiency. Detector 17 detects an envelope of an input signal thereto.

A first feedback loop formed from phase modulator 13, high power amplifier 15, directional coupler 16, detector 17, error amplifier 18 and analog multiplier 21 constructs an envelope feedback loop. The circuits forming the envelope feedback loop have characteristics that they operate at a rate sufficiently higher (higher by 10 times or more) than the rate (for example, 64 kbps) at which a modulated signal is to be transmitted. Analog multiplier 21 is provided to vary the reference value for the envelope feedback loop to vary the output power of the transmitter.

Further, directional coupler 16, detector 17, RMS smoothing circuit 29, error amplifier 32 and analog multiplier 20 form an ALC loop. The ALC loop is constructed so as to adjust the operation rate of one of the components thereof which may operate at the lowest rate (for example, RMS smoothing circuit 29 or error amplifier 32) so that the circuit may operate at a rate at which a modulating signal can be smoothed (for example, at a rate lower than one tenth the rate of the modulating signal).

The reference voltage is inputted from reference voltage terminal 30 so as to adjust the output of transmission power of the transmitter.

Next, operation of the present embodiment is described. First, a signal of a high frequency oscillated and outputted from oscillator 11 is inputted as a carrier to phase modulator 13 by way of buffer amplifier 12. Meanwhile, a band-limited base band signal is inputted from input terminal 19 and supplied to analog multipliers 20 and 21. Analog multiplier 21 multiplies the input base band signal and the output signal of error amplifier 18, which will be hereinafter described, inputted thereto, and supplies a result of the multiplication as a modulating signal to phase modulator 13.

Phase modulator 13 performs BPSK modulation of the input modulating signal wherein the phase of the carrier from buffer amplifier 12 is changed to 0 degree and 180 degrees corresponding to "1" and "0" of the logic value of the input modulating signal, respectively, and supplies a thus obtained modulated wave of a fixed amplitude to high power amplifier 15.

The modulated wave power-amplified by high power amplifier 15 to a level required for transmission is branched by directional coupler 16, and one of the branched modulated waves is outputted to output terminal 36 while the other branched modulated wave is envelope detected by detector 17 and then supplied to error amplifier 18 and RMS smoothing circuit 29. Meanwhile, analog multiplier 20 multiplies the base band signal from input terminal 19 and the output signal of error amplifier 32, which will be hereinafter described, inputted thereto and supplies a result of the multiplication to rectifier 22.

Error amplifier 18 amplifies an error signal between the envelope detection signal from detector 17 and the output signal of analog multiplier 20 full wave rectified by rectifier 22 and supplies the thus amplified error signal to analog multiplier 21. Accordingly, the carrier inputted to phase modulator 13 is phase modulated with a signal obtained by multiplying the error signal obtained by error amplifier 18 and the base band signal from input terminal 19 by means of analog multiplier 21 of the envelope feedback loop.

Figure 7:
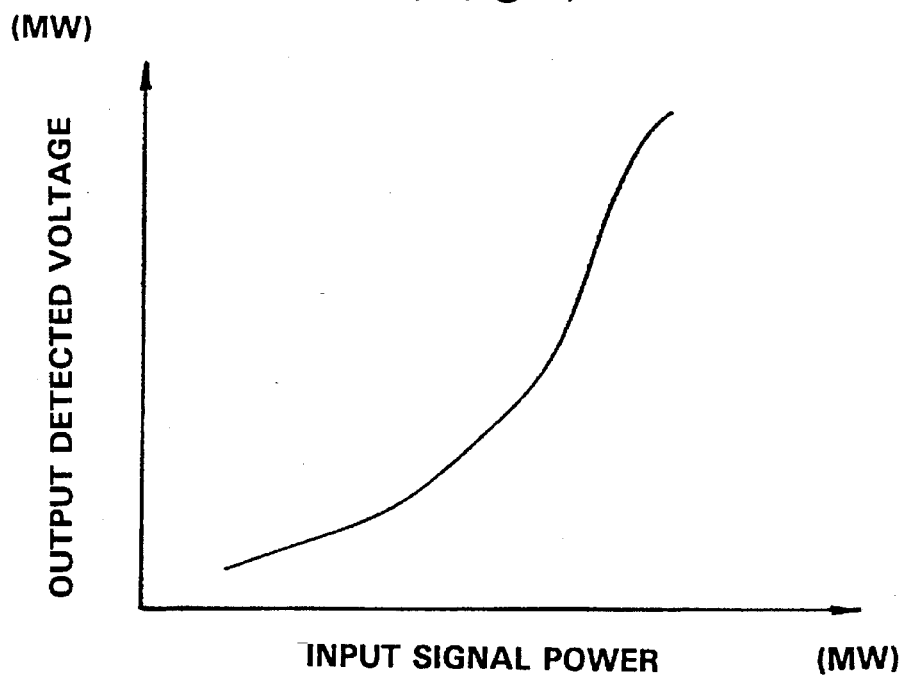
FIG. 7 is a diagram showing an example of an input signal power to output detected voltage characteristic of a detector of FIG. 2.

Here, detector 17 has such an input signal power to output detected voltage characteristic as shown in FIG. 7. As can be seen from FIG. 7, since a diode is normally used for detector 17, the input signal power to output detected voltage characteristic of it does not exhibit a linear characteristic but exhibits a non-linear characteristic corresponding to the diode characteristic.

Figure 8:
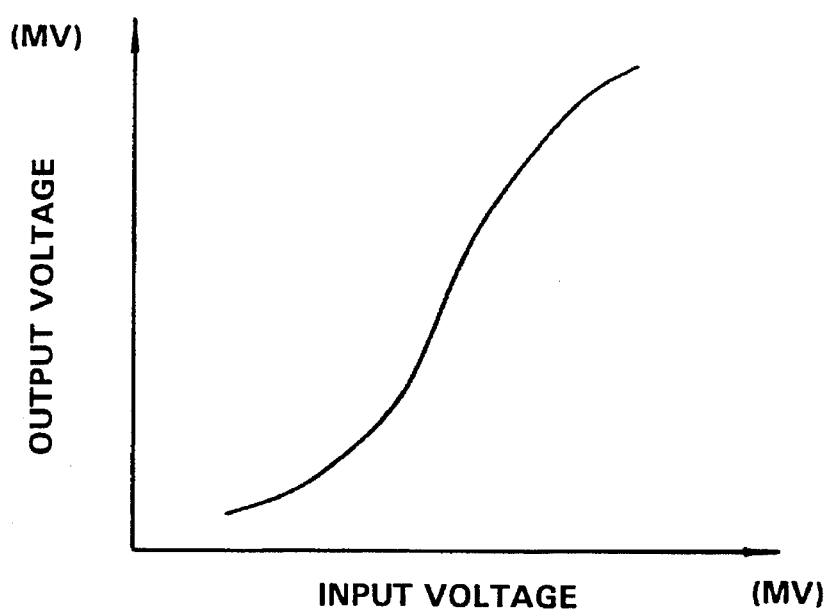
FIG. 8 is a diagram showing an example of an input voltage to output voltage characteristic of a rectifier of FIG. 2.

Meanwhile, since the input voltage to rectifier 22 corresponds to the amplitude of the input voltage to detector 17, the input voltage to output voltage characteristic of rectifier 22 is set so as to correspond to the input signal voltage to output detected voltage characteristic of detector 17 as shown in FIG. 8. Accordingly, the envelope feedback loop controls the envelope so that the base band signal may coincide with the envelope of the modulated wave detected by detector 17.

Further, in the present embodiment, the output envelope detection signal of detector 17 is smoothed in root mean square value (RMS) thereof by RMS smoothing circuit 29 and then supplied to error amplifier 32, by which an error between the smoothed root mean square value (RMS) from RMS smoothing circuit 29 and a first reference voltage from reference voltage terminal 30 is detected and amplified. The error signal from error amplifier 32 is supplied to analog multiplier 20. By analog multiplier 20, the error signal is multiplied by the base band signal from input terminal 19, and a thus obtained multiplication result signal is full wave rectified by rectifier 22 and inputted as a reference amplitude signal for the envelope feedback loop to error amplifier 18.

Accordingly, in the present embodiment, even if a variation of the gain of high power amplifier 15 or the like occurs, the reference amplitude signal for the envelope feedback loop is controlled by the ALC loop which feeds back so that the smoothed level of the root mean square value of the envelope detection signal and the first reference voltage may coincide with each other, and consequently, fixed output power corresponding to the first reference voltage is obtained at output terminal 36.

Figure 3:
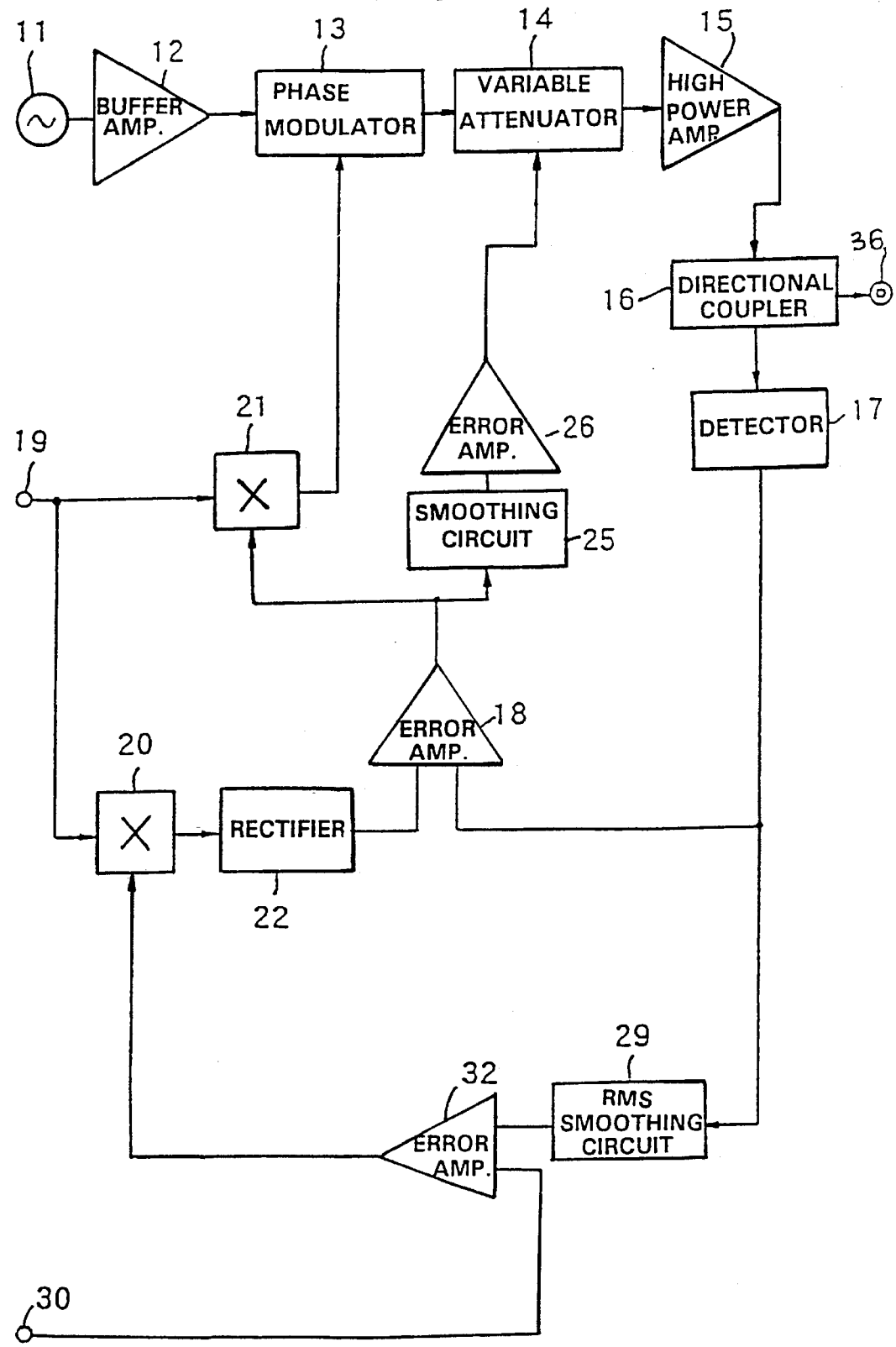
FIG. 3 is a block diagram of a second embodiment of the present invention.

Next, in the second embodiment of the present invention, variable attenuator 14, error amplifier 26 and smoothing circuit 25 are additionally provided as shown in FIG. 3. Variable attenuator 14 attenuates an input signal thereto with an attenuation rate corresponding to the output signal of error amplifier 26.

Further, a second feedback loop formed from variable attenuator 14, high power amplifier 15, directional coupler 16, detector 17, error amplifier 18, smoothing circuit 25 and error amplifier 26 constructs an operation point feedback loop. The operation point feedback loop is constructed so as to adjust the operation rate of one of the components thereof which may operate at the lowest rate (for example, smoothing circuit 25 or error amplifier 26) so that the circuit may operate at a rate at which the automatic level control (ALC) loop, which will be hereinafter described, does not diverge (for example, at a rate lower than one tenth the rate of the ALC loop).

Phase modulator 13 performs BPSK modulation of the input modulating signal wherein the phase of the carrier from buffer amplifier 12 is changed to 0 degree and 180 degrees corresponding to "1" and "0" of the logic value of the input modulated signal, and supplies a thus obtained modulated wave of a fixed amplitude to variable attenuator 14. Variable attenuator 14 attenuates the input modulated wave with an attenuation rate corresponding to the output signal of error amplifier 26 which will be hereinafter described and supplies the attenuated modulated wave to high power amplifier 15.

Further, in the second embodiment, the error output signal of error amplifier 18 is supplied also to smoothing circuit 25, by which it is smoothed (integrated). Then, the output of smoothing circuit 25 is amplified by error amplifier 26 and supplied as a control signal to variable attenuator 14. Accordingly, the aforementioned operation point feedback loop which controls the variable attenuator 14 smoothes the error of the output envelope detection signal of detector 17 and controls variable attenuator 14 so that the smoothed error may exhibit a minimum value.

Figure 4:
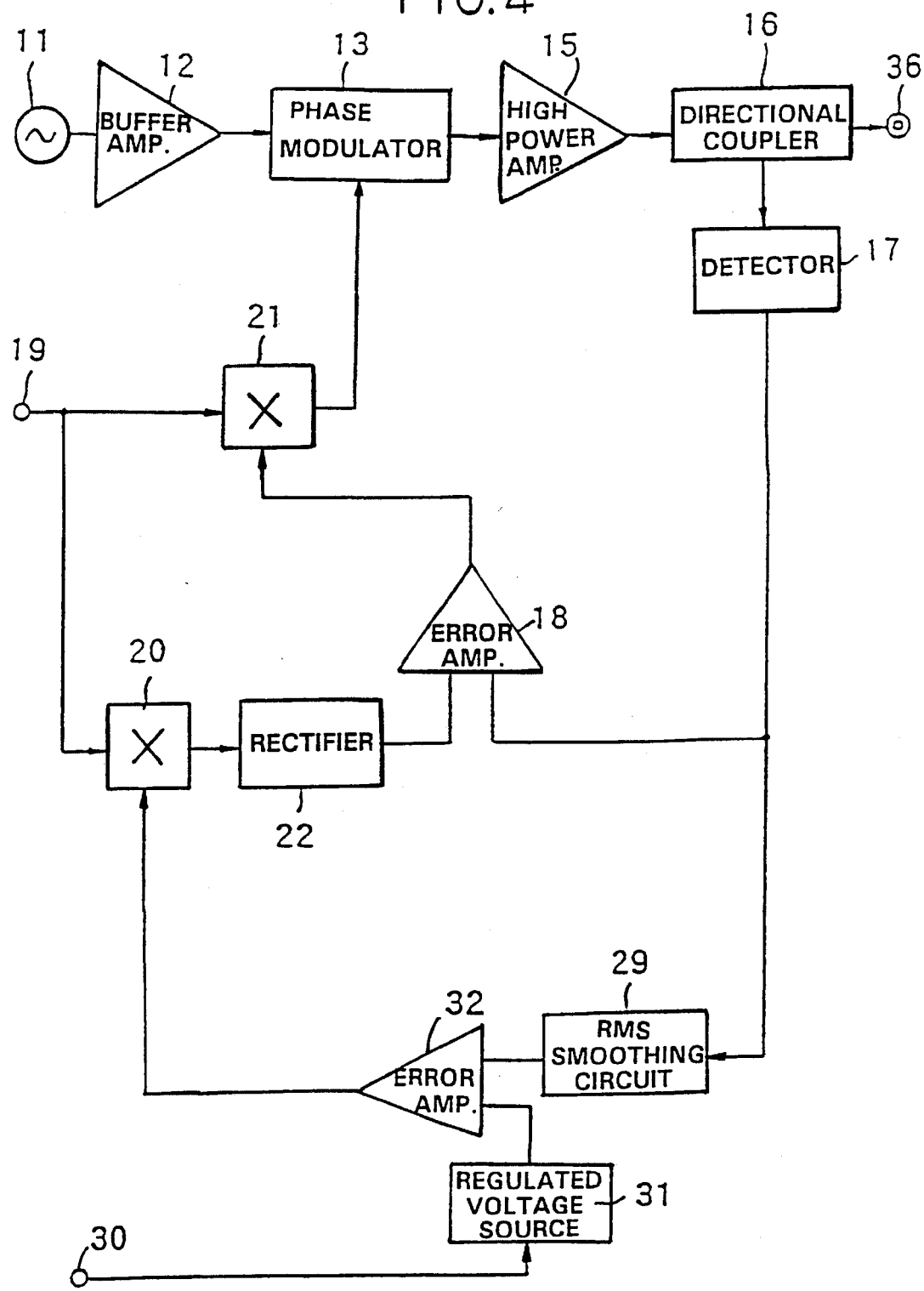
FIG. 4 is a block diagram of a third embodiment of the present invention.
Figure 5:
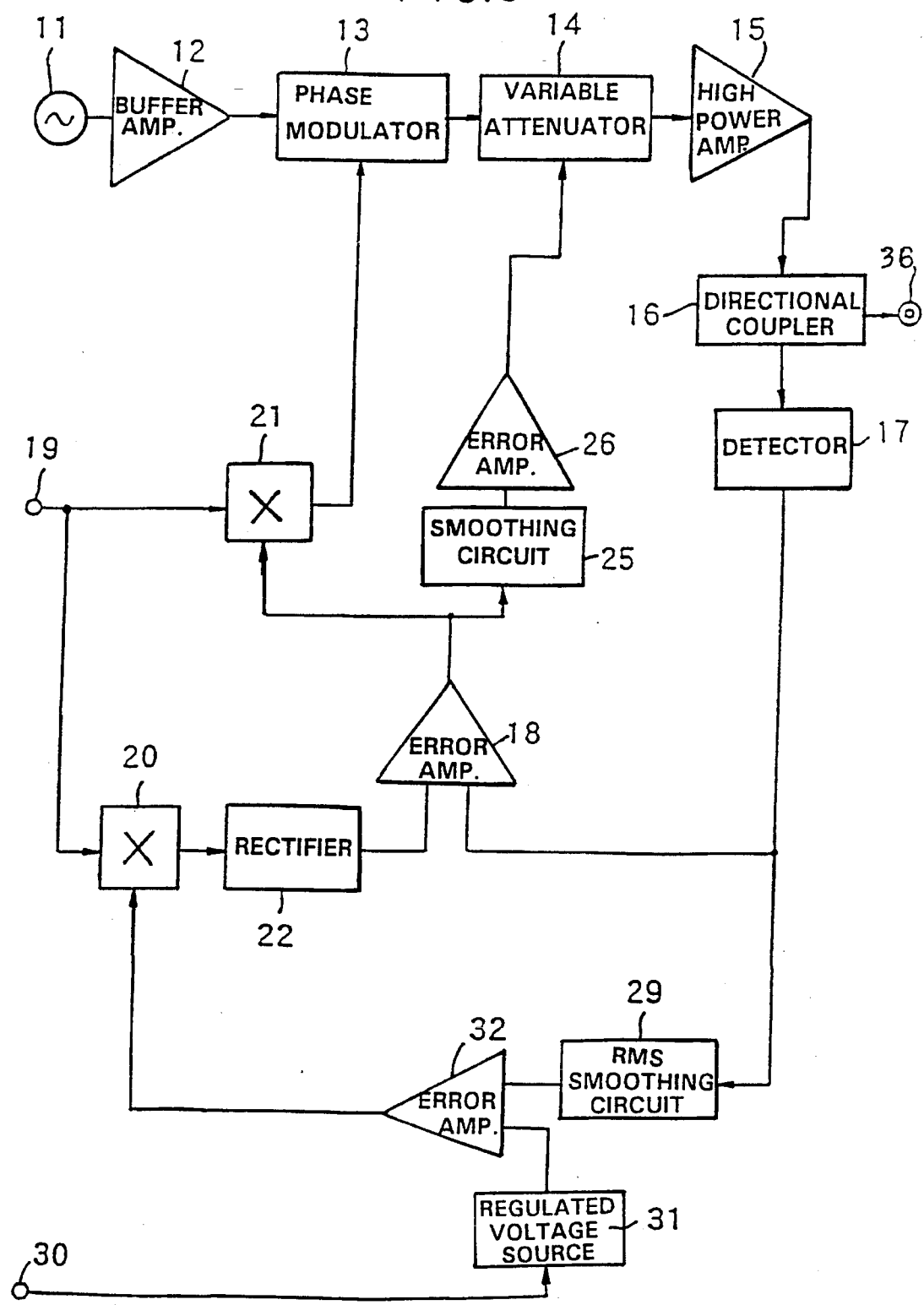
FIG. 5 is a block diagram of a fourth embodiment of the present invention.

Meanwhile, in the third embodiment and the fourth embodiment of the present invention, as shown in FIGS. 4 and 5, the first reference voltage outputted from regulated voltage source 31 can be varied as variable reference voltage in accordance with an output level control signal from reference voltage terminal 30, and consequently, the modulated wave power level to be outputted to output terminal 36 can be varied as variable modulated wave power level in accordance with the output level control signal. The output modulated wave of output terminal 36 is transmitted from a transmission outputting element not shown.

Figure 6:
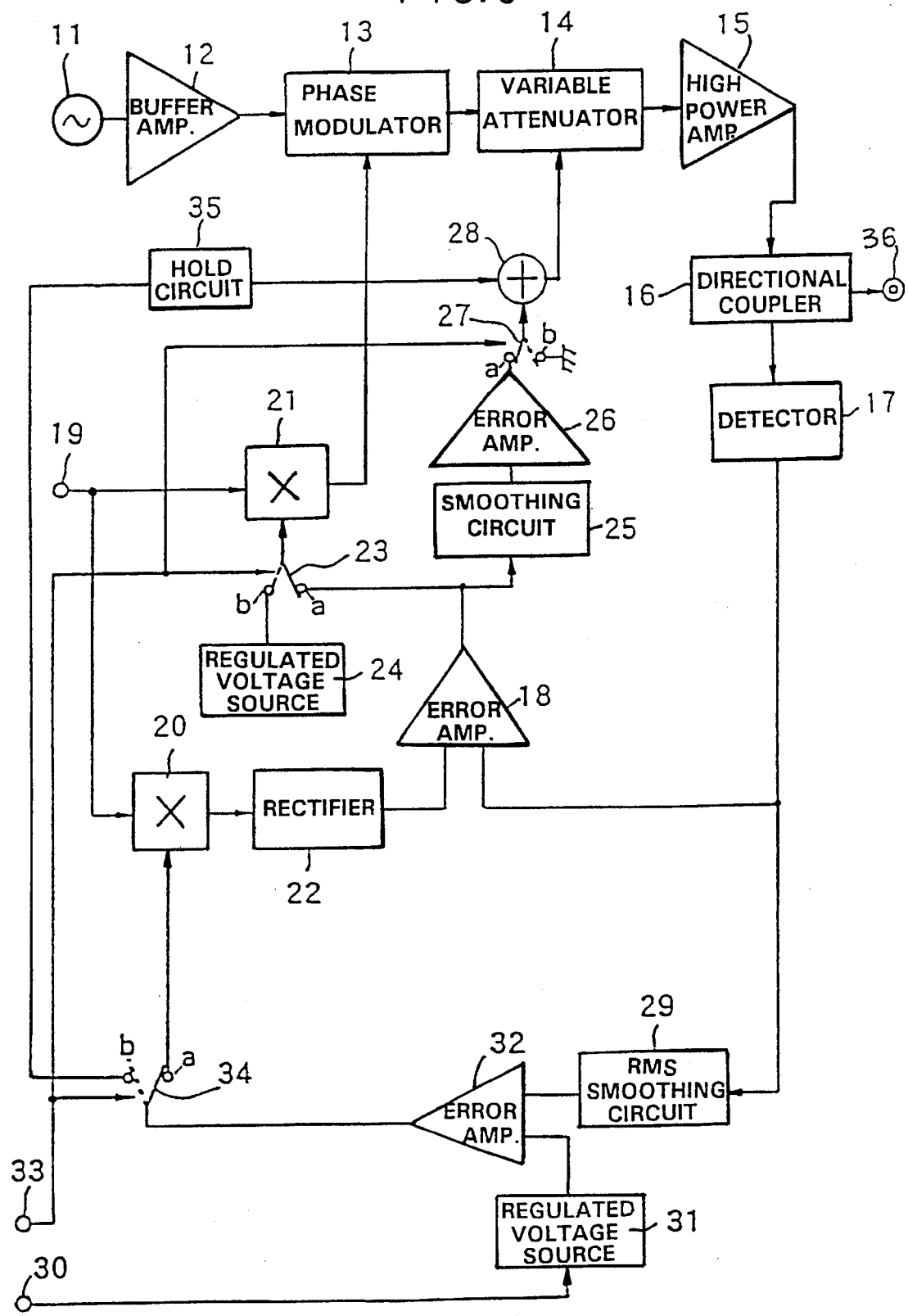
FIG. 6 is a block diagram of a fifth embodiment of the present invention.

Next, the fifth embodiment of the present invention is described with reference to FIG. 6. As shown in FIG. 6, in the fifth embodiment of the present invention, switches 23, 27 and 34, regulated voltage source 24, adder 28 and hold circuit 35 are added to the construction of the block diagram of the fourth embodiment.

Each of switches 23, 27 and 34 is switched to one of terminals a and b in accordance with a switch control signal inputted thereto by way of input terminal 33. Regulated voltage source 24 generates and outputs a predetermined second reference voltage to one of the terminals of switch 23.

Operation of the fifth embodiment is described below. It is assumed that, in accordance with a switch control signal inputted from input terminal 33, each of switches 23, 27 and 34 is first connected to terminal a side as shown in FIG. 6.

Consequently, the output signal of error amplifier 18 is inputted to one of a pair of input terminals of analog multiplier 21; the output signal of error amplifier 26 is inputted to one of a pair of input terminals of adder 28; and the output signal of error amplifier 32 is inputted to one of a pair of input terminals of analog multiplier 20.

A signal of a high frequency oscillated and outputted from oscillator 11 is inputted as a carrier to phase modulator 13 by way of buffer amplifier 12. Meanwhile, a band-limited base band signal is inputted from input terminal 19 and supplied to analog multipliers 20 and 21. Analog multiplier 21 multiplies the inputted base band signal and the output signal of error amplifier 18, which will be hereinafter described, inputted thereto by way of switch 23, and supplies a result of the multiplication as a modulating signal to phase modulator 13.

Phase modulator 13 performs BPSK modulation of the input modulating signal wherein the phase of the carrier from buffer amplifier 12 is changed to 0 degree and 180 degrees corresponding to "1" and "0" of the logic value of the input modulating signal, respectively, and supplies a thus obtained modulated wave of a fixed amplitude to variable attenuator 14. Variable attenuator 14 attenuates the inputted modulated wave with an attenuation rate corresponding to the output signal of adder 28, which will be hereinafter described, and supplies the attenuated modulated wave to high power amplifier 15.

The modulated wave power-amplified by high power amplifier 15 to a level required for transmission is branched by directional coupler 16, and one of the branched modulated waves is outputted to output terminal 36 while the other branched modulated wave is envelope detected by detector 17 and then supplied to error amplifier 18 and RMS smoothing circuit 29. Meanwhile, analog multiplier 20 multiplies the base band signal from input terminal 19 and the output signal of error amplifier 32, which will be hereinafter described, inputted thereto by way of switch 34 and supplies a result of the multiplication to rectifier 22.

Error amplifier 18 amplifies an error signal between the envelope detection signal from detector 17 and the output signal of analog multiplier 20 full wave rectified by rectifier 22 and supplies the thus amplified error signal to analog multiplier 21 by way of switch 23. Accordingly, the carrier inputted to phase modulator 13 is phase modulated with a signal obtained by multiplying the error signal obtained by error amplifier 18 and the base band signal from input terminal 19 by means of analog multiplier 21 of the envelope feedback loop described above.

Further, in the present embodiment, the error output signal of error amplifier 18 is supplied also to and smoothed (integrated) by smoothing circuit 25 and then amplified by error amplifier 26, whereafter it is supplied as a control signal to variable attenuator 14 by way of switch 27 and adder 28. Accordingly, the aforementioned operation point feedback loop which controls the variable attenuator 14 smoothes the error of the output envelope detection signal of detector 17 and controls variable attenuator 14 so that the smoothed error may exhibit a minimum value.

Furthermore, in the present embodiment, the output envelope detection signal of detector 17 is smoothed in root mean square value (RMS) thereof by RMS smoothing circuit 29 and then supplied to error amplifier 32, by which an error between the smoothed root mean square value (RMS) from RMS smoothing circuit 29 and a first reference voltage from reference voltage source 31 is detected and amplified. The error signal from error amplifier 32 is supplied to analog multiplier 20 by way of switch 34. By analog multiplier 20, the error signal is multiplied by the base band signal from input terminal 19, and a thus obtained multiplication result signal is full wave rectified by rectifier 22 and inputted as a reference amplitude signal for the envelope feedback loop to error amplifier 18.

Accordingly, even if a variation of the gain of high power amplifier 15 or the like occurs, the reference amplitude signal for the envelope feedback loop is controlled by the ALC loop which feeds back so that the smoothed level of the root mean square value of the envelope detection signal and the first reference voltage may coincide with each other, and the envelop feedback loop controls so that fixed output power corresponding to the first reference voltage is obtained at output terminal 36.

In this manner, with the present embodiment, when switches 23, 27 and 34 are individually connected to terminal a side in accordance with the switch control signal from input terminal 33, an amplitude distortion which is produced by high power amplifier 15 is eliminated by the envelope feedback loop. Further, since the operation point of the operation point feedback loop is automatically controlled to an optimum operation point by the ALC loop, a stabilized distortion improvement effect can be obtained even when the output level varies.

Next, operation of the present embodiment when switches 23, 27 and 34 are individually switched and connected to terminal b side in accordance with the switch control signal from input terminal 33. As a result of the connection, the second reference voltage of regulated voltage source 24 is inputted to one of the input terminals of analog multiplier 21; one of the input terminals of adder 28 is substantially opened; and the output signal of error amplifier 32 is supplied not to analog multiplier 20 but to hold circuit 35. In other words, both of the envelope feedback loop and the operation point feedback loop are opened.

In this instance, the error signal between the smoothed level of the root mean square value of the envelope detection signal and the second reference voltage generated by error amplifier 32 is supplied by way of switch 34 to and held by hold circuit 35 and is then supplied as a control signal to variable attenuator 14 by way of adder 28. Accordingly, when switches 23, 27 and 34 are individually switched and connected to terminal b side, an ordinary ALC loop is formed, and consequently, even if the output level varies over a wide range, a power-amplified modulated wave of a stabilized level is obtained at output terminal 36 without causing degradation in amplitude distortion or variation of the output level.

If the output level of output terminal 36 drops, then since the input voltage to output voltage characteristic of rectifier 22 and the input signal voltage to output detected voltage characteristic of detector 17 are displaced from each other, the distortion improvement effect by the envelope feedback loop and the operation point feedback loop is decreased and, in the worst case, deteriorated. However, by switching and connecting switches 23, 27 and 34 to terminal b side individually in accordance with a switch control signal to open both of the envelope feedback loop and the operation point feedback loop so as to form an ordinary ALC loop as described above, a power-amplified modulated wave of a stabilized level is obtained at output terminal 36.

In this manner, with the present embodiment, since a distortion generated by high power amplifier 15 can be reduced remarkably, the specifications for the saturation output and the linearity of high power amplifier 15 can be moderated. Further, since mere single circuits of phase modulator 13 and detector 17 are required as a phase modulator and an envelope detector for a high frequency and most of the other circuits can be formed as an integrated circuit (IC), the power dissipation can be reduced from that of conventional transmitters and the transmitter can be constructed with a small size.

It is to be noted that the present invention is not limited to the embodiments described above. For example, a peak hold circuit may be used for smoothing in place of RMS smoothing circuit 29. Further, it is possible in principle to adopt, as a modulation system for a modulator, a linear modulation system such as a four phase shift keying (QPSK) system or an amplitude modulation system. Further, while, in the embodiments described above, an envelope feedback loop, an operation point feedback loop and an ALC loop are provided, the operation point feedback loop need not necessarily be provided.

As described above, according to the present invention, since the envelope feedback loop controls so that the base band signal and the envelope of the modulated wave may be same as each other and the reference amplitude of the envelope feedback loop to be supplied from the first multiplier to the second error signal generating means can be varied by the ALC loop formed from the detector, the first error signal generating means and the first multiplier, an amplitude distortion produced by the power amplifier can be improved very much, and a modulated wave of a fixed power which depends upon the first reference voltage irrespective of a variation of the gain of the power amplifier and so forth can be outputted to an output terminal.

Further, due to the distortion improvement effect, the specifications for the saturation output and the linearity of the power amplifier can be moderated. Further, since most of the circuits can be formed as an integrated circuit, the transmitter can be produced with a less expensive construction of reduced power dissipation and a reduced size comparing with conventional transmitters.

Further, according to the present invention, since the operation point feedback loop controls so that the smoothed value of the error output signal of the second error signal generating means may be in the minimum, the operation point of the operation point feedback loop is always controlled to an optimum control point automatically, and a stabilized distortion improvement effect can be obtained even when the output level varies.

Further, according to the present invention, since the first reference voltage can be varied by the voltage varying means, the reference amplitude of the envelope of the envelope feedback loop can be varied arbitrarily, and consequently, the output power of the power amplifier can be varied to an arbitrary value.

Furthermore, according to the present invention, since, when the output power of the power amplifier is lower than the predetermined value, the envelope feedback loop and the operation point feedback loop are opened while a feedback loop by which the error output signal of the first error signal generating means is inputted as the control signal to the variable attenuator is formed by means of the first to third switches, when the output voltage is equal to or higher than the predetermined value, a distortion improvement effect by the envelope feedback loop and the operation point feedback loop is obtained, but when the output power is at a level lower than the predetermined value and an insufficient distortion improvement effect is provided by the envelope feedback loop and the operation point feedback loop, an ordinary ALC operation is performed. Consequently, it can be prevented that, even if the output level varies over a wide range, a distortion is deteriorated or the output level varies discontinuously.

What is claimed is:

1. A transmitter, comprising:

a modulator for linearly modulating a carrier from an oscillator with a modulating signal and outputting a modulated wave;

a power amplifier for power amplifying the output modulated wave of said modulator;

a directional coupler for branching the power amplified modulated wave from said power amplifier into two branched modulated waves, one of which is outputted to a transmission outputting element;

a detector for detecting an envelope of the other branched modulated wave from said directional coupler;

first error signal generating means for generating and outputting an error signal between a smoothed signal of the output detection signal of said detector and a first reference voltage;

a first multiplier for multiplying the error output signal of said first error signal generating means and a band-limited base band signal;

second error signal generating means for generating and outputting an error signal between the output detection signal of said detector and a full wave rectified signal of an output signal of said first multiplier; and a second multiplier for multiplying the error output signal of said second error signal generating means and the base band signal and supplying a result of the multiplication as the modulating signal to said modulator.

2. A transmitter as claimed in claim 1, further comprising:

a variable attenuator for attenuating the output modulated wave of said modulator in accordance with a control signal and outputting the attenuated signal to said power amplifier; and a smoothing circuit for smoothing the error output signal of said second error signal generating means and outputting a signal obtained by the smoothing as the control signal to said variable attenuator.

3. A transmitter as claimed in claim 2, further comprising:

voltage varying means for varying the first reference voltage to a variable reference voltage to be inputted to said first error signal generating means.

4. A transmitter as claimed in claim 2, further comprising:

a first switch for outputting the error output signal of said first error signal generating means to said first multiplier when output power of said power amplifier is equal to or higher than a predetermined value but outputting, when the output power is lower than the predetermined value, the error output signal of said first error signal generating means as the control signal to said variable attenuator;

a second switch for outputting the error output signal of said second error signal generating means to said second multiplier when the output power is equal to or higher than the predetermined value but outputting, when the output power is lower than the predetermined value, a second reference voltage to said second multiplier; and a third switch for outputting the output signal of said smoothing circuit to said variable attenuator when the output power is equal to or higher than the predetermined value but intercepting, when the output power is lower than the predetermined value, outputting of the output signal of said smoothing circuit to said variable attenuator.

5. A transmitter as claimed in claim 1, further comprising:

voltage varying means for varying the first reference voltage to a variable reference voltage to be inputted to said first error signal generating means.

* * * * *